METHODS OF MANUFACTURING A SEMICONDUCTOR DEVICE

Filed Jan. 14, 1971 2 Sheets-Sheet 1

United States Patent Office 3,730,778
Patented May 1, 1973

3,730,778

METHODS OF MANUFACTURING A SEMICONDUCTOR DEVICE

John Martin Shannon, Reigate, and John Anthony Kerr, East Grinstead, England, assignors to U.S. Philips Corporation Filed Jan. 14, 1971, Ser. No. 106,489
Claims priority, application Great Britain, Jan. 15, 1970, 1,996/70
Int. Cl. H01l 7/54
U.S. Cl. 148—1.5 7 Claims

ABSTRACT OF THE DISCLOSURE

A method of manufacturing a bipolar transistor in which impurities are introduced into a semiconductor body through a non-planar semiconductor body surface, the nature of the exposed surface being controlled so that the p-n junction formed has a desired contour. An emitter region of the transistor may be formed within a mesa of the semiconductor body surface and the collector junction formed by implantation of base impurity through both the mesa and the adjacent portions of the surface to give a mesa-shaped collector junction and a substantially plane emitter junction. The mesa may be defined by a silica pattern and formed by silicon nitride masking, etching and oxidation.

Figure 1:
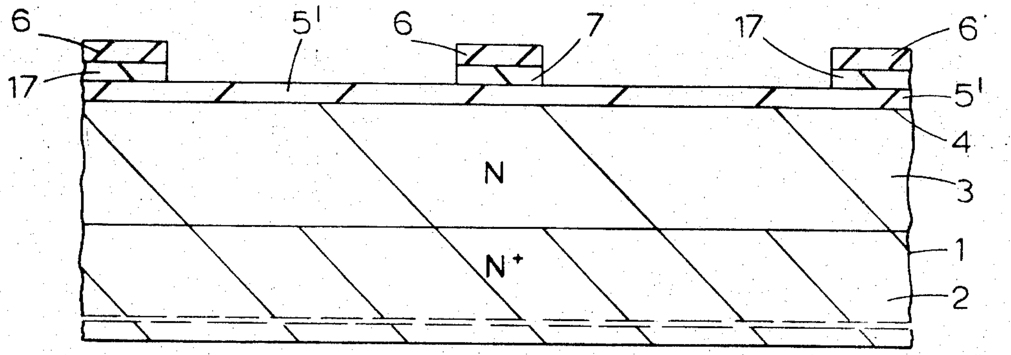

This invention relates to methods of manufacturing a semiconductor device, comprising providing in a monocrystalline semiconductor body emitter and collector regions of one conductivity type of a transistor and a base region of the opposite conductivity type, and further relates to semiconductor devices manufactured using such methods, for example semiconductor devices consisting of a discrete transistor or semiconductor integrated circuits including a transistor as one of the circuit elements.

It is known that the contour of the base-collector p-n junction has an important effect on characteristics of a transistor, for example the reverse breakdown voltage and the maxium frequency of operation of the transistor. Usually the emitter and base regions are formed by introduction of impurity elements of one conductivity type and the opposite conductivity type respectively into a semiconductor body to form a planar transistor structure in which the base-collector junction surrounds the emitter-base junction within the semiconductor body and both junctions terminate at a substantially plane surface of the body below an adherent protective and insulating layer on the body surface; in devices manufactured by several such methods, the portion of the base-collector p-n junction below the emitter region is situated at a deeper level within the body than adjacent portions of the base-collector p-n- junction. Such a base-collector junction contour limits the breakdown voltage and operating frequency of the transistor and, as such, is undesirable for devices operating at high voltage and/or frequency.

It is well known that such an undesirable base-collector junction contour occurs when the emitter region is formed by impurity diffusion into a previously diffused base region; this effect is known as the "emitter-dip" or "base push-out" effect. To reduce this effect, it is known to form the base region and the emitter-base and base-collector p-n- junctions simultaneously by a base impurity diffusion through a previously diffused emitter region concentration, see British patent specification No. 1,145,121.

It is proposed in U.S. Pat. No. 3,595,716 to form the base region by ion implantation through a body portion containing a previously provided emitter region impurity concentration. The emitter region impurity concentration may be provided by impurity diffusion into a portion of a plane surface of the body which is exposed by an opening in an insulating layer pattern on the said surface. During the diffusion a glass layer is formed in the opening and may have a thickness which is less than that of adjacent parts of the insulating layer pattern. The implantation of ions to form the base region may be effected partially through the glass layer and partially through the adjacent parts of the insulating layer pattern; however due to the greater partial masking effect of the insulating layer pattern, the ions have a deeper penetration in the part of the semiconductor body immediately below the glass layer, and this results in the base-collector junction formed extending slightly deeper in this part of the body. This difficulty may be overcome by removing prior to the ion implantation part or all of the insulating layer pattern and the glass layer. However, often this involves difficulties in relocating at a subsequent stage of manufacture the previously-provided emitter region impurity concentration and necessitates providing a further insulating and passivating layer for the manufactured device.

According to the invention, in a method of manufacturing a semiconductor device, comprising providing in a monocrystalline smiconductor body emitter and collector regions of one conductivity type of a transistor and a base region of the opposite conductivity type, the semiconductor body is provided with a non-planar semiconductor body surface having thereon an insulating and passivating layer which is interrupted at an aperture therein by a plateau portion of the non-planar semiconductor body surface, and an impurity element characteristic of the said opposite conductivity type is introduced into the semiconductor body by ion implantation through the said plateau portion and through the adjacent, surrounding portion of the insulating and passivating layer to form in the body a base-collector p-n junction of which the portion formed directly below the said plateau portion is situated no further from the plane of the said plateau portion than adjacent portions of the base-collector p-n junction, the emitter region being provided so as to extend into the semiconductor body from the said plateau portion.

Since the said impurity element is introduced into the semiconductor body by ion implantation through the said plateau portion and through the adjacent, surrounding portion of the insulating and passivating layer, the said aperture in the insulating and passivating layer defines the location of the said plateau portion of the non-planar semiconductor body surface for a subsequent stage of manufacture, and the desired contour of the base-collector p-n junction formed is determined by controlling the contour of the surface portion through which the said impurity element is introduced. The provision of the plateau portion of the non-planar semiconductor body surface at the said aperture in the insulating and passivating layer enables the partial masking effect of the insulating and passivating layer on the base-collector p-n junction contour to be compensated. The partial masking effect of the insulating and passivating layer is determined by its thickness and composition and the ion range therein compared with that in the semiconductor material. In several cases, an insulating and passivating material can be chosen in which the ion range is substantially the same as in a semiconductor material, for example silica and silicon.

The said ion implanation may be effected through a layer present on the said plateau portion. Such a layer may be, for example, a thin glass layer formed during diffusion of emitter region impurity, and can influence favorably the contour of the base-collector junction formed, so that, for example, the junction portion formed directly below the plateau portion is situated nearer the plane of the said plateau portion than adjacent portions of the junction. In certain cases, such a layer on the said plateau portion may even be an emitter electrode, for example.

The surface portion through which the said impurity element is introduced to form the base-collector p-n junction may be a substantially plane surface portion consisting of the plateau portion of the non-planar semiconductor body surface and the said adjacent, surrounding surface portion of the insulating and passiviating layer; introduction of the said impurity element through such an exposed plane surface to form the base-collector p-n junction can result in the portion of the base-collector junction formed directly below the said plateau portion being situated at substantially the same distance as adjacent portions of the junction from the plane of the said plateau portion. In another form, the said surface portion may be non-planar and the plateau portion of the semiconductor body surface may form a plateau portion elevated above the said adjacent, surrounding portion of the insulating and passiviating layer; introduction of the said impurity element through such non-planar surface portion can result in the portion of the base-collector junction formed directly below the said plateau portion being situated nearer the plane of the said plateau portion than adjacent portions of the base-collector junction.

The said plateau portion may be provided by localised epitaxial growth of semiconductor material on a substantially plane semiconductor body surface, the epitaxial growth occurring at an aperture in a masking layer of insulating and passivating material on the semiconductor body surface. Semiconductor material may further be deposited on the masking layer, and excess semiconductor material may be removed by mechanical lapping to the level of the masking layer so forming the plateau portion of the resulting non-planar semiconductor body surface at the aperture in the masking layer– the masking layer then forms the said insulating and passivating layer on the non-planar semiconductor body surface.

In the formation of the said plateau portion of a non-planar semiconductor body surface, exposed portions of a substantially plane surface of the semiconductor body may be chemically etched, a portion of the substantially plane surface which is protected by a masking layer pattern provided thereon against attack by the etchant forming the said plateau portion. Isotropic etching can result in a semiconductor body surface having low local curvatures, and the resulting semiconductor body surface with the said plateau portion can be termed a mesa-structure. A base-collector junction formed by impurity element introduction through such a mesa-structure can have low local curvatures and a desirable mesa-shaped contour.

A masking layer pattern used to protect a surface portion against attack by an etchant in the formation of a non-planar semiconductor body surface may comprise a variety of materials, depending on the nature of the etchant, for example silica, silicon nitride, or a suitable metal. Further processing steps may be effected with at least part of the masking layer pattern retained, thereby defining the location of the plateau portion, and depending on its nature, the layer pattern may serve a further function, for example as a further masking layer pattern when forming the said insulating and passivating layer, as an impurity element source for the formation of the emitter region, or as the emitter contact electrode.

The insulating and passivating layer may be formed by deposition on the whole of a non-planar semiconductor body surface, and semiconductor body portions may be exposed subsequently, for example by a controlled lapping technique to form the semiconductor plateau portion surrounded at an aperture therein by the insulating and passivating layer.

The provision of the insulating and passivating layer on the semiconductor body surface can be achieved in a comparatively simple manner when the semiconductor body consists of silicon, by exposing portions of the silicon body surface to an oxidation treatment. When the said plateau portion is formed using masking and etching, and the semiconductor body consists of silicon, then, after forming the said plateau portion with the aid of a masking layer pattern, portions of the resulting silicon surface not covered by the masking layer pattern may be subjected to an oxidation treatment to form a silica insulating and passivating layer at the silicon body surface, the said plateau portion being protected by the masking layer pattern against oxidation. The silica layer formed by such an oxidation treatment is not provided on the original etched non-planar silicon body surface but is partially inset therein. The said masking layer pattern may be of silicon nitride.

A variety of techniques may be used to form the emitter region. A conventional diffusion technique from a gas stream, or ion implantation may be employed. A further technique which may be employed in certain circumstances is an implantation method such as "Knock-on Implantation;" in this case, the impurity element is provided on a surface portion and bombarded with energetic ions which by energy transfer cause atoms of the impurity element to penetrate the surface portion and enter the semiconductor body.

It is desirable to confine the emitter region to substantially the elevated body portion associated with the plateau portion of the non-planar semiconductor body surface so as to reduce the parasitic emitter capacitance by confining the area of the emitter-base junction to a substantially planar portion lying substantially parallel to the plateau portion of the semiconductor body surface. This may be achieved in a variety of ways. An impurity element characteristic of the one conductivity type and associated with the emitter region may be introduced into the semiconductor body through a substantially plane surface, and the said plateau portion be formed subsequently by etching portions of the substantially plane surface. In another form, the said plateau portion of the semiconductor body surface and the emitter region are formed simultaneously, for example by localized epitaxial growth of a high conductivity layer portion of the said one conductivity type. In a further form, the plateau portion and other portions of the non-planar surface and the insulating and passivating layer thereon are formed prior to the introduction into the body of the emitter region impurity element concentration.

As is known, an insulating and passivating layer may act as a mask restricting impurity introduction. As mentioned hereinbefore, the said aperture in the insulating and passivating layer on the non-planar semiconductor body surface defines the location of the said plateau portion of that surface. Thus, after providing the non-planar semiconductor body surface having thereon the insulating and passivating layer which is interrupted at the aperture therein by the said plateau portion, the emitter region may be formed by introduction of an impurity element characteristic of the one conductivity type into the body through the plateau portion, the insulating and passivating layer masking adjacent portions of the semiconductor body surface against introduction of the said impurity element. The said impurity element characteristic of the one conductivity type and associated with the emitter region may be introduced into the body through the exposed plateau portion by diffusion from a gas stream. When such a diffusion technique is employed, the resulting emitter-base p-n junction formed with the base region terminates at the semiconductor body surface below the insulating and passivating layer; in such a case, a so-called "washed-out" emitter contact may be made to the plateau portion at the aperture in the insulating and passivating layer without short-circuiting the emitter-base junction.

Since the contour of the base-collector p-n junction is determined by the contour of the surface portion through which the impurity element of the said opposite conductivity type is implanted into the semiconductor body, undesirable consequences of effects such as the "base push-out" effect can be compensated by controlling the contour of an appropriate non-planar part of this surface portion. Thus, it is possible to introduce atoms of the impurity element associated with the emitter region into a previously provided base region impurity element concentration without forming an undesirable base-collector p-n junction contour. However, in a preferred form, the impurity element characteristic of the one conductivity type and associated with the emitter region is introduced into the body, and the location of the emitter-base and the base-collector p-n junctions are determined simultaneously by subsequently implanting in the body the impurity element characteristic of the said opposite conductivity type and associated with the base region of the transistor. In this case, other adjacent portions of the non-planar semiconductor body surface may be, for example, at most 0.3 micron below the plane of the said plateau portion.

An embodiment of the invention will now be described, by way of example, with reference to the accompanying diagrammatic drawings, in which FIGS. 1 to 6 are cross-sectional views of a portion of a semiconductor body at various stages during the manufacture of a discrete bipolar transistor.

The starting material is an n-type monocrystalline silicon body 1, a portion of which is shown in FIG. 1. The body 1 comprises an $n^+$ substrate 2 of 0.008 ohm-cm. resistivity and 200 microns thickness on which is provided by epitaxial growth an n-type epitaxial layer 3 of 0.5 ohm-cm. resistivity and 3 microns thickness. The body 1 has its major surfaces normal to the <111> direction. In general, several discrete bipolar transistors are manufactured from a common semiconductor wafer by forming an array of transistor elements simultaneously on the wafer and dividing the wafer to form individual semiconductor bodies for each discrete transistor. However, the method of manufacture described herein with reference to FIGS. 1 to 6 will be in terms of the semiconductor body for one discrete transistor rather than the whole semiconductor wafer. It will be evident that where steps such as photolithographic and etching techniques, diffusion, implantation and annealing are referred to, these operations are effected either simultaneously at a plurality of locations on the wafer or to the whole wafer so that a plurality of individual transistor elements are formed which are separated by dividing the wafer at a later stage of manufacture.

On a substantially plane silicon body surface 4, which is a surface of the n-type epitaxial layer 3, a layer of silicon nitride 5' with a thickness of 0.25 micron is provided by heating the body at a temperature of 950° C. and at atmospheric pressure in a gas current consisting of hydrogen, with 30% by volume of ammonia and 1% by volume of silane ($SiH_4$). Subsequently, pure hydrogen is passed over the body 1, and the body 1 is allowed to cool.

A silicon oxide layer of 0.2 micron thick is provided in known manner on the silicon nitride layer 5' by sputtering. After applying an etch-resistant masking pattern 6 provided photographically by means of a photoresist, the silicon oxide layer on the silicon nitride layer 5' is removed locally by etching in known manner with concentrated hydrofluoric acid to form a silicon oxide mask portion 17 having an aperture of 30 microns by 40 microns and surrounding a silicon oxide mask portion 7 having an area of 3 microns by 20 microns. The body 1 is subsequently rinsed with de-ionized water. The resulting structure is shown in FIG. 1.

An etching treatment is effected using orthophosphoric acid ($H_3PO_4$) at a temperature of 230° C. to remove the non-masked parts of the silicon nitride layer. Although the photoresist material 6 is removed by the phosphoric acid at the temperature used, the nitride located below the oxide mask portions 7 and 17 is maintained in the short etching time in which the phosphoric acid acts on the silicon oxide mask portions 7 and 17 originally covered by the photoresist. Rinsing is carried out in the conventional manner in de-ionized water followed by drying.

The remaining silicon nitride consists of a silicon nitride portion 18 having an aperture with a width of approximately 30 microns and surrounding a silicon nitride portion 5 with a width of 3 microns.

Figure 2:
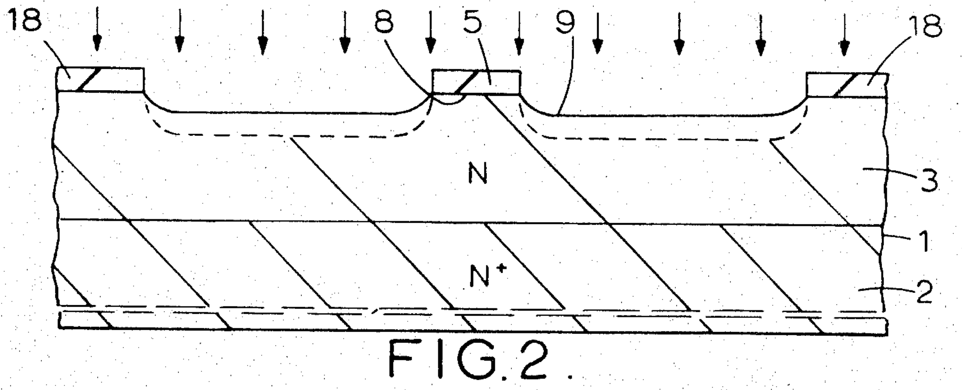

The silicon nitride portions 5 and 18 together with remaining portions of the silicon oxide masks 7 and 17 constitute a masking layer pattern on the substantially plane silicon body surface 4 to protect portions of the surface 4 during a subsequent etching treatment. An isotropic etchant solution comprising 1 part by volume of hydrofluoric acid in 20 parts of nitric acid is employed. The etching treatment is continued until exposed portions of the substantially plane silicon body surface 4 are etched to a depth of 0.25 micron. The portion of the surface 4 protected by the silicon nitride portion 5 forms a plateau portion 8 of area approximately 3 microns by 20 microns. The resulting silicon body surface 9 includes a mesa structure as shown in FIG. 2. Any remaining portions of the silicon oxide portions 7 and 17 are removed by etching.

The silicon nitride layer 5 on the mesa structure is employed as a further masking layer pattern in two subsequent manufacturing stages, namely during a boron implanation to form adjacent the surface 9 high conductivity base contact portion and during an oxidation treatment to form at the surface 9 a silicon oxide layer as a mask in the formation of the emitter region and as an insulating and passivating layer. The employment of the same silicon nitride layer 5 as a masking layer pattern in these two subsequent stages as well as during the etching stage to define the said plateau portion 8, defines the location of the said plateau portion 8 during subsequent stages of manufacture; in this manner, the extent of the high conductivity base contact portion, the silicon oxide layer, and the emitter region in relation to the said plateau portion 8 can be controlled.

To form the high conductivity base contact portion, the body 1 is placed in the target chamber of an ion implanation apparatus and bombarded, as indicated by arrows in FIG. 2, with boron ions. The bombarding boron ions, which are obtained from an ion source consisting of boron trichloride, are implanted in the silicon body surface 9 at an energy of 40 kev. and a dose of approximately $10^{15}$ atoms/cm.$^2$. The orientation of the body is such that there is an angle of 7° between the ion beam axis and the <111> direction. The silicon nitride portions 5 and 18 act as masks absorbing the majority of the boron ions bombarding the surface thereof so that boron ions are implanted selectively in the n-type epitaxial layer 3 through the exposed portion of the silicon body surface 9 around the silicon nitride portion 5. In FIG. 2 the implanted boron portion of the epitaxial layer 3 is shown in broken outline. This portion which is annular extends from the surface 9 to a depth of approximately 0.25 micron and is annealed by heating during subsequent stages of manufacture to form a high conductivity base contact portion 16 of the transistor.

Figure 3:
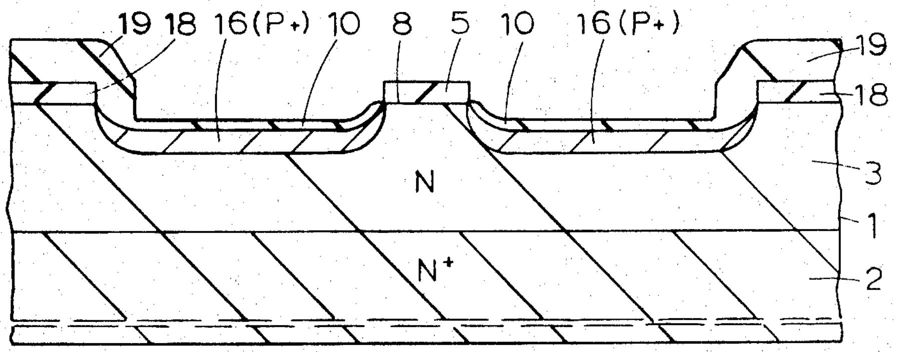
Figure 4:
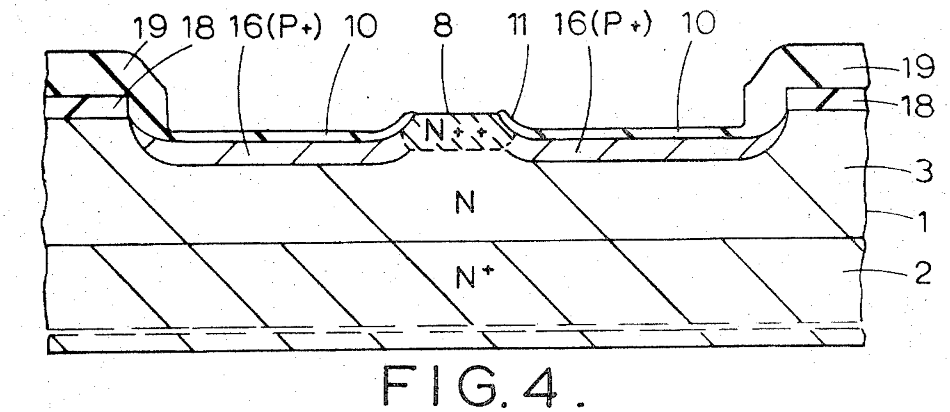
Figure 5:
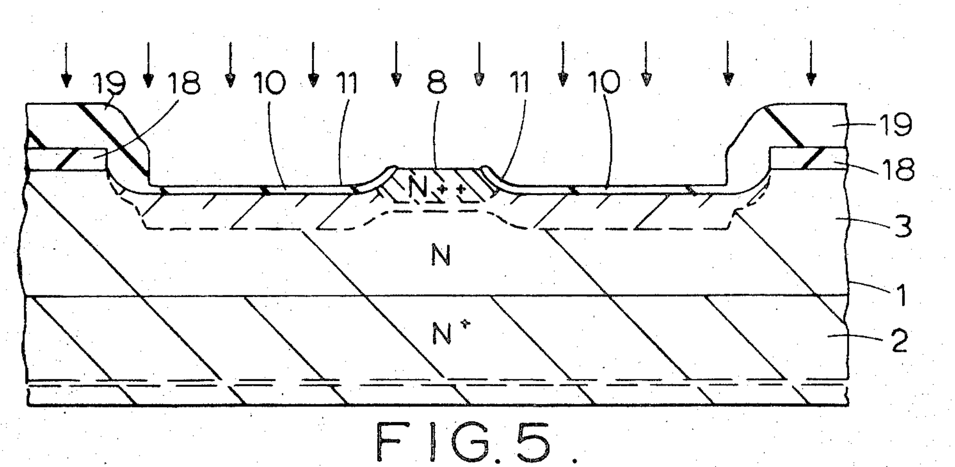

Silica is now deposited over the whole surface 9, by either a pyrolytic or sputtering process, to form a layer having a thickness of approximately 1 micron. A central portion of the layer around the mesa structure and the silicon nitride portion 5 is removed by etching to form a thick silica layer pattern 19 which is employed as a mask during the subsequent base impurity implantation to ensure that the base-collector junction formed terminates at the non-planar semiconductor body surface. The resulting structure is shown in FIG. 3.

Exposed portions of the silcon body surface 9 not covered by the silicon nitride portion 5 are oxidised subsequently by exposure to steam at a pressure of 1 atmosphere and at a temperature of 1,000° C. to form a thin silicon oxide layer 10 having a thickness of 1,200

A. (0.12 micron). The thin silicon oxide layer 10 is inset over approximately 0.05 micron of its thickness in the original mesa-shaped silicon body surface 9 and is interrupted at an aperture therein by the plateau portion 8 of the surface 9 protected by the silicon nitride layer 5 against oxidation; the plateau portion 8 is elevated approximately 0.2 micron above the major portion of the exposed surface of the silicon oxide layer 10, and approximately 0.3 micron above adjacent, surrounding portions of the non-planar silicon body surface, see FIGS. 4 and 5.

After the oxidation treatment, the silicon nitride layer 5 is removed by etching with phosphoric acid. In this manner, the plateau portion 8 of the silicon body surface and the aperture in the thin silicon oxide layer 10 are exposed, and a non-planar surface portion 11 formed consisting of the surface of the thin silicon oxide layer 10 and the silicon body surface plateau portion 8. Through this non-planar surface portion 11 donor and then acceptor impurity elements are introduced to form emitter and base regions respectively of the transistor.

The body 1 is placed in a diffusion furnace maintained at 900° C., and the donor impurity element concentration of the emitter region is formed by diffusion of phosphorus atoms from a gas stream containing phosphorus derived from phosphine ($PH_3$) into the n-type epitaxial layer 3 through the exposed plateau portion 8 of the silicon body surface. The silicon oxide layer 10 masks adjacent portions of the silicon body surface against diffusion of phosphorus atoms. The extent of the diffusion front is shown in broken outline in FIG. 4, and the resulting diffused phosphorus concentration at the plateau portion 8 of the surface is approximately $10^{21}$ atoms/cc. During the diffusion, a thin phosphosilicate glass layer is formed on the exposed plateau portion 8 of the silicon body surface and to a lesser extent on the surface of the silicon oxide layer 10. If desired this thin phosphosilicate glass layer can be removed, by etching, before effecting further manufacturing stages.

The location of the emitter-base and the base-collector p-n junctions are determined simultaneously by introducing into the silicon body 1 are acceptor impurity element associated with the base region of the transistor. This is effected by bombarding the non-planar surface 11 with energetic boron ions as indicated by arrows in FIG. 5. The body 1 is situated in the target chamber of the ion implanation apparatus, the ion source consisting of boron trichloride. The implantation is carried out in steps either with increasing or decreasing energies in the range of 10 kev. to 130 kev. at a dose of approximately $10^{14}$ atoms/cm.$^2$, and the orientation of the body is such that there is an angle of 7° between the ion beam axis and the <111> direction. Implantation of boron ions occurs through the plateau portion 8 and through adjacent portions of the non-planar surface portion 11. The thick silica layer pattern masks the underlying body portion against the implantation. Subsequent annealing treatment is effected at a temperature between 600° C. and 800° C. for 30 minutes. The implanted boron ions form the base-collector junction with the original donor impurity concentration of the n-type epitaxial layer 3 and the emitter-base junction with the higher diffused donor impurity element concentration associated with the emitter region.

Boron ions penetrating the thin silicon oxide layer 10 have substantially the same range in both the thin silicon oxide layer 10 and the silicon epitaxial layer 3. Consequently, the contour of the resulting base-collector junction is substantially the same as the contour of the non-planar surface portion 11 consisting of the surface of the silicon oxide layer 10 and the silicon body surface plateau portion 8. Since the plateau portion 8 through which the emitter region was formed is elevated above other, adjacent portions of the non-planar surface portion 11, then, the portion of the base-collector p-n junction formed below the emitter region is situated nearer the plane of the plateau portion 8 than adjacent portions of the base-collector p-n junction, even though the silicon oxide layer 10 was employed as a mask for the emitter impurity element diffusion and the base-collector junction was formed by implantation therethrough.

Figure 6:
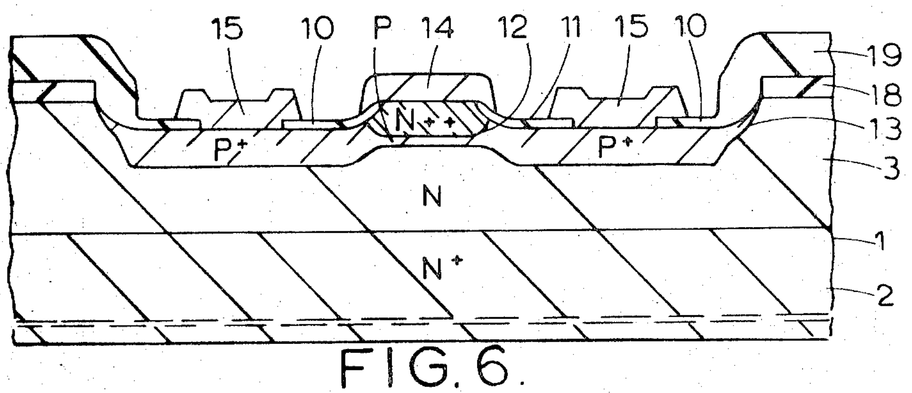

The emitter-base junction and base-collector junction are designated by numerals 12 and 13 respectively in FIG. 6.

After the annealing treatment the portion of the base-collector junction 13 below the emitter region is situated approximately 0.5 micron from the plane of the plateau portion 8, and the emitter-base junction 12 is situated approximately 0.4 micron from the plane of the plateau portion 8, so giving a base region width of approximately 0.1 micron. Portions of the base-collector junction 13 adjacent the portion below the emitter region are situated at approximately 0.7 micron from the plane of the plateau portion 8.

Since the emitter region was formed by diffusion through the plateau portion 8 at the opening in the silicon oxide layer 10, the emitter-base junction formed is substantially planar and parallel to the plateau portion 8, and terminates at the silicon body surface below the thin silicon oxide layer 10. Portions of the silicon oxide layer 10 are retained in the manufactured device as an insulating and passivating layer.

Openings are formed subsequently in the thin silicon oxide layer 10 and the thin phosphosilicate glass layer removed to permit contact to the base and emitter regions respectively. Removal of the thin glass layer, to re-expose the silicon body surface plateau portion 8 associated with the emitter region, is effected using a so-called "washed-out" emitter technique by dipping the body 1 in a very weak hydrofluoric acid solution for a few seconds; in this case, because of the silicon oxide-coated mesa structure, the technique is not critical, since approximately 0.3 micron of silicon oxide is present between the edge of the plateau portion 8 and the termination of the emitter-base junction 12 at the surface. By a further photoprocessing and etching step, openings of approximately 4 microns x 20 microns are formed in the thin silicon oxide layer 10 to expose surface portions of the high conductivity base contact portions 16 of the base region.

A layer of aluminum of 0.5 micron thickness is then deposited over the whole surface, and the aluminum layer is selectively removed by a further photoprocessing and etching step to leave an emitter contact metal layer 14 and a base contact metal layer 15. The emitter contact layer 14 is in the form of a finger of 4 microns width which is situated in the aperture of the silicon oxide layer 10 at the plateau portion 8 previously occupied by the glass layer, extends over the silicon oxide layer 10 on each side of the aperture and terminates in a large area bonding pad on the silicon oxide layer 10. The base contact layer 15 comprises two fingers each of 5 microns width which further extend over the silicon oxide layer 10 and terminate in a common, large area bonding pad on the silicon oxide layer 10. The high conductivity substrate 2 provides the collector electrode.

The body 1 comprising the transistor element is mounted in an envelope, after sub-dividing the wafer. Connections to the emitter and base bonding pads are made, and encapsulation is then effected by a commonly employed method.

What we claim is:

1. A method of manufacturing a semiconductor device containing in a monocrystalline semiconductor body emitter and collector regions of one conductivity type of a transistor and a base region of the opposite conductivity type, comprising the steps of forming on the semiconductor body a non-planar semiconductor surface including a plateau portion and having thereon an insulating and passivating layer containing an aperture defining the said plateau portion, introducing an impurity element characteristic of the said opposite conductivity type by ion implantation into the semiconductor body through the said plateau portion via the said aperture and through the adjacent, surrounding portion of the insulating and passivating layer to form in the body a base-collector p-n junction of which the portion formed directly below the said plateau portion is spaced from the plane of the said plateau portion a distance equal to or less than that of adjacent portions of the base-collector p-n junction, and providing in the body an emitter region which extends into the semiconductor from the said plateau portion.

2. A method as claimed in claim 1, wherein the said plateau portion is formed by etching exposed portions of a substantially plane surface of the body surrounding the plateau portion while it is protected by a masking layer against attack by the etchant.

3. A method as claimed in claim 2, wherein after the etching step, while the masking layer remains, the body is subjected to an oxidation treatment to form a silica insulating and passivating layer at the silicon body surface except for the said plateau portion protected by the masking layer pattern against oxidation.

4. A method as claimed in claim 1, wherein after providing the non-planar semiconductor body surfaces having thereon the insulating and passivating layer containing the aperture defining the said plateau portion, the emitter region is formed by introduction of an impurity element characteristic of the one conductivity type into the body through the plateau portion, the insulating and passivating layer masking adjacent portions of the semiconductor body surface against introduction of the said one-type impurity element.

5. A method as claimed in claim 4, wherein after formation of the emitter region, an emitter contact electrode is provided which contacts the plateau portion of the emitter region at the said aperture in the insulating and passivating layer.

6. A method as claimed in claim 1, wherein the impurity element characteristic of the one conductivity type to form the emitter region is first introduced into the body, and thereafter the location of the emitter-base and the base collector p-n junctions are determined simultaneously by subsequently implanting in the body the impurity element characteristic of the said opposite conductivity type to form the base region of the transistor.

7. A method as claimed in claim 6, wherein other adjacent portions of the non-planar semiconductor body are at most 0.3 micron below the plane of the said plateau portion.

References Cited

UNITED STATES PATENTS

| | | | |
|---|---|---|---|
| 3,098,954 | 7/1963 | Misra | 317—234 |
| 3,220,896 | 11/1965 | Miller | 148—175 X |
| 3,484,309 | 12/1969 | Gilbert | 148—33.5 |
| 3,530,343 | 9/1970 | Irie et al. | 317—235 |

CHARLES N. LOVELL, Primary Examiner

J. M. DAVIS, Assistant Examiner

U.S. Cl. X.R.

148—187; 317—234 R, 235 R